(12) United States Patent
Baltussen (10) Patent No.: US 8,366,423 B2
(45) Date of Patent: Feb. 5, 2013

(54) METHOD AND ARRANGEMENT FOR REALIZING A VACUUM IN A VACUUM CHAMBER

(75) Inventor: Sander Baltussen, Breda (NL)

(73) Assignee: Mapper Lithography IP B.V., Delft (NL)

(*) Notice: Subject to any disclaimer, the term of this patent is extended or adjusted under 35 U.S.C. 154(b) by 292 days.

(21) Appl. No.: 12/709,643

(22) Filed: Feb. 22, 2010

(65) Prior Publication Data

US 2010/0269911 A1 Oct. 28, 2010

Related U.S. Application Data

(60) Provisional application No. 61/306,333, filed on Feb. 19, 2010, provisional application No. 61/154,415, filed on Feb. 22, 2009, provisional application No. 61/289,407, filed on Dec. 23, 2009.

(51) Int. Cl.
*F04B 41/06* (2006.01)
*C23C 16/00* (2006.01)

(52) U.S. Cl. ........... 417/901; 417/2; 417/3; 417/148; 417/423.4; 417/5; 137/565.23

(58) Field of Classification Search .......... 417/2, 3, 417/5, 148, 423.4, 901; 137/565.23
See application file for complete search history.

(56) References Cited

U.S. PATENT DOCUMENTS

| | | | |
|---|---|---|---|
| 4,725,204 A | 2/1988 | Powell | |
| 4,911,103 A * | 3/1990 | Davis et al. ........... | 118/725 |
| 5,088,895 A * | 2/1992 | Webb ..................... | 417/53 |
| 5,971,711 A * | 10/1999 | Noji et al. .............. | 417/2 |
| 5,993,165 A | 11/1999 | Lorimer et al. | |
| 6,174,366 B1 | 1/2001 | Ihantola | |
| 6,573,520 B1 | 6/2003 | Satoh et al. | |
| 6,817,377 B1 * | 11/2004 | Reimer et al. ......... | 137/565.23 |
| 8,089,055 B2 * | 1/2012 | Brailove ................ | 250/492.2 |
| 8,192,547 B2 * | 6/2012 | Gotthold et al. ....... | 118/724 |
| 2001/0001950 A1 | 5/2001 | Kawamura et al. | |

FOREIGN PATENT DOCUMENTS

| | | |
|---|---|---|
| JP | 59174286 A | 10/1984 |
| JP | 07282993 A | 10/1995 |
| JP | 2001057153 A | 2/2001 |

\* cited by examiner

*Primary Examiner* — Nikita Wells
(74) *Attorney, Agent, or Firm* — David P. Owen; Coraline J. Haitjema; Hoyng Monegier LLP (57) ABSTRACT

The invention relates to a method of realizing a vacuum in a vacuum chamber. The vacuum chamber is connected to a pumping system shared by a plurality of vacuum chambers. The method includes separately pumping down each vacuum chamber. The invention further relates to n arrangement of a plurality of vacuum chambers connected to a pumping system. In this arrangement, the pumping system is arranged for pumping down each vacuum chamber separately.

26 Claims, 6 Drawing Sheets

METHOD AND ARRANGEMENT FOR REALIZING A VACUUM IN A VACUUM CHAMBER

CROSS REFERENCE TO RELATED APPLICATIONS

This application claims priority to U.S. provisional application No. 61/154,415 filed on Feb. 22, 2009, U.S. provisional application No. 61/289,407 filed on Dec. 23, 2009, and U.S. provisional application No. 61/306,333 filed on Feb. 19, 2010. All three applications are hereby incorporated by reference in their entirety.

BACKGROUND OF THE INVENTION

1. Field of the Invention

The present invention relates to a vacuum chamber arrangement, a vacuum chamber comprising an outlet for connection to a pumping system, and a method of realizing a vacuum in a vacuum chamber.

2. Description of the Related Art

In the semiconductor industry, an ever increasing desire to manufacture smaller structures with high accuracy and reliability makes great demands on wafer processing technology. In particular, it is important to maximize wafer throughput of wafer processing equipment while maintaining the lowest possible capital costs and operational costs, and without excessive use of floor space. Floor space in a semiconductor manufacturing environment is not only extremely expensive, but also requires high operational costs to maintain the required clean room conditions. In order to meet these requirements, it is desirable that lithography machines remain in operation continuously as far as possible.

BRIEF SUMMARY OF THE INVENTION

The present invention aims to provide a method and lithography system which meets these requirements while permitting high throughput operation to result in a machine design providing good economics. The present invention provides for a design philosophy according to which the machine is split up into a plurality of mutually independently operating and independently serviceable lithography machines forming a machine cluster, each machine operating in a high vacuum. In order to realize this design philosophy in an economically viable and space efficient manner, the invention provides an arrangement for realizing a vacuum in a vacuum chamber in a machine cluster. For this purpose, the present invention provides a method of realizing a vacuum in a vacuum chamber wherein the vacuum chamber is connected to a pumping system shared by a plurality of vacuum chambers, the method comprising separately pumping down each vacuum chamber. Furthermore, the present invention provides an arrangement of a plurality of vacuum chambers connected to a pumping system, wherein the pumping system is arranged for pumping down each vacuum chamber separately.

By combined use of the same pumping system by the vacuum chambers it is not necessary to equip each vacuum chamber with separate equipment for establishing the vacuum. As a result, the costs of the total pumping system may be considerably reduced. Additionally, the shared pumping system occupies less fab floor space than a plurality of pumping systems would have occupied, which in itself provides its own economic and functional advantage.

According to another aspect, the invention solves a problem particularly associated with the use of charged particle lithography. In such systems a continuous trade-off is made between a requirement for extremely tight electro-magnetic (EM) shielding of the projection column of such systems, and a requirement to provide a normally high vacuum in the same space in order to be able to perform charged particle projection. The two requirements are in opposition, in that the EM shielding requirement is preferably realized by full enclosure of the space for performing charged particle projection, while the requirement to generate a high vacuum, especially in a molecular flow suction regime, preferably requires a large suction opening. This problem typically results in a compromise, by using a small opening in the EM shield in combination with accepting a relatively long pump down time of the charged particle system.

According to further insight underlying the invention, a cryogenic system may be utilized for assisting in creating the high vacuum and reducing the pump down time of the lithography system, while still having a suction opening reduced in size with a view to optimizing EM shielding. Such arrangements have been disfavored due to the high cost of cryogenic systems, and due to the need to retain a conventional vacuum pumping system because the cryogenic pump system operates from a predefined minimum level of vacuum. However, despite this prejudice, the invention makes use of such a combination of pumps for a charged particle lithography system, to enable a better EM shielding while avoiding excessive pump down time (i.e. non-operational time). The application of a cryogenic pumping system to the charged particle system solves the trade off. The economic viability and practical applicability of this combination is further enhanced when it is applied in combination with the clustered machine concept, in particular when applied as a shared pump system.

One aspect of the invention comprises a pumping system comprising a vacuum pump system and a cryopump system. Such combination can be used to bring down the pressure in a vacuum chamber up to very low pressure values, e.g. down to $10^{-6}$ mBar, in particular if the vacuum is realized by both the vacuum pump system and the cryopump system. To realize the vacuum, the vacuum pump system may be activated first followed by activation of the cryopump system. This activation order may result in activation of the cryopump system at a lower pressure value than would be the case if it would have been activated simultaneously with the vacuum pump system. The activation at a lower pressure may cause the cryopump system to saturate at a lower pressure value.

The vacuum pump system may comprise a fore pump and at least one turbomolecular pump. Activation of the vacuum pump system may then comprise activating the fore pump first followed by activating the at least one turbomolecular pump. The use of such vacuum pump system may result in a relatively fast realization of a pressure value below 1 mBar. The fore pump may be deactivated a predetermined time period after activating the at least one turbomolecular pump.

Each vacuum chamber may be connected to a separate turbomolecular pump. The use of a single turbo pump per vacuum chamber allows for a two tiered arrangement of pumps and with a reduction of piping. The method may further comprise closing a flow regulation device to isolate the turbo pump from the vacuum chamber, and deactivating the turbomolecular pump. These actions may result in a reduced influence of external vibrations.

For a vacuum chamber may be provided with an outlet connecting the vacuum chamber to a separate turbomolecular pump, the method may further comprise varying a cross-sectional area of the outlet. During initial pumpdown from atmospheric pressure towards a relatively rough vacuum, e.g. 1 mBar, the cross-sectional area of the outlet is preferably large to decrease pumpdown time. At lower pressures, a smaller cross-sectional area of the outlet may be desirable, for example to fully benefit from a cryopump system. Varying the cross-sectional area of the outlet may thus allow for a relatively fast pumpdown in combination with a relatively large resource efficiency.

Varying the cross-sectional area of the outlet may comprise blocking at least part of the outlet by means of a moveable member. The member may take the form of a plate. Preferably, the moveable member comprises an electromagnetic shielding material such as mu metal. This allows for effective shielding of components within the vacuum chamber against external electromagnetic radiation, while the vacuum can be maintained by pumping through the partially blocked outlet.

The cryopump system used in some embodiments of the invention may comprise a cooling fluid reservoir or cooling unit, a plurality of cryogenic surface structures and cooling lines connecting the cooling fluid reservoir or cooling unit with the cryogenic surface structures. The cryopump system may further comprise one or more flow regulation devices. the flow regulation devices are arranged to control transfer of cooling fluid through the cooling lines to or away from one or more cryogenic surface structures. Preferably, The cryopump system comprises two flow regulation devices per cryogenic surface structure. A flow regulation device at both input and output of the surface structure simplifies the addition and/or removal of the surface structures in the cryopump system. The cryogenic surface structure may take different forms, for example the form of a shield or a spiral. A spiral is relatively easy to manufacture, while a shield has a large surface area.

In some embodiments of the invention, the wall of a vacuum chamber is arranged to accommodate a cryogenic surface structure. This surface structure may take the form of a thermoelectric cooling element, like a so-called Peltier element. A thermoelectric cooling element can operate at low voltages, may be relatively cheap, and can operate while being cooled with ordinary cooling fluids like water. The cooling element may contact the outside surface of a wall portion of the vacuum chamber. In this case, voltage connections do not need to transfer through the vacuum chamber wall, which simplifies the vacuum chamber design.

In some embodiments, at least one vacuum chamber comprises one or more light emitting diodes emitting radiation in the ultraviolet spectrum. Alternatively, a vacuum chamber is arranged with dedicated wall portions for allowing the coupling of ultraviolet radiation into the chamber. The use of UV-radiation stimulate outgassing at predetermined locations in the vacuum chamber. The increased outgassing may allow for a more effective pumpdown and a lower pressure value within the vacuum chamber.

The invention further provides a vacuum chamber comprising an outlet for connection to a pumping system, the outlet having a variable cross-sectional area. An outlet with a variable cross-sectional area allows for variation of the pumping capacity provided by the pumping system. A reduced pumping capacity may be sufficient if the pressure within a vacuum chamber is below a certain threshold value. If the cross-sectional area of the outlet can be reduced at that time, the pumping capacity of the pumping system not being used by the vacuum chamber can be used for other purposes, for example for assisting in the pump down of another vacuum chamber.

Reducing the cross-sectional area of the outlet may be accomplished by using a moveable member, for example a slideable plate. The member can block at least part of the outlet. Preferably the member comprises an electromagnetic shielding material, like a mu metal to block external electromagnetic radiation.

Additionally, the invention relates to a method of realizing a vacuum in an arrangement comprising at least two vacuum chambers, a pumping system, and a flow regulation device for allowing connection between the pumping system and either one of the vacuum systems. The method comprises connecting the pumping system with a predetermined vacuum chamber by modulation of the flow regulation device; and pumping down the predetermined vacuum chamber with the pumping system. The method may be performed by a computer readable medium, when executed by a processor. The processor may be located in a control unit for regulating the flow regulation device.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the drawings.

Throughout the description the expression "vacuum" is referring to a state where the pressure is lower than $10^{-3}$ mBar.

Figure 1:
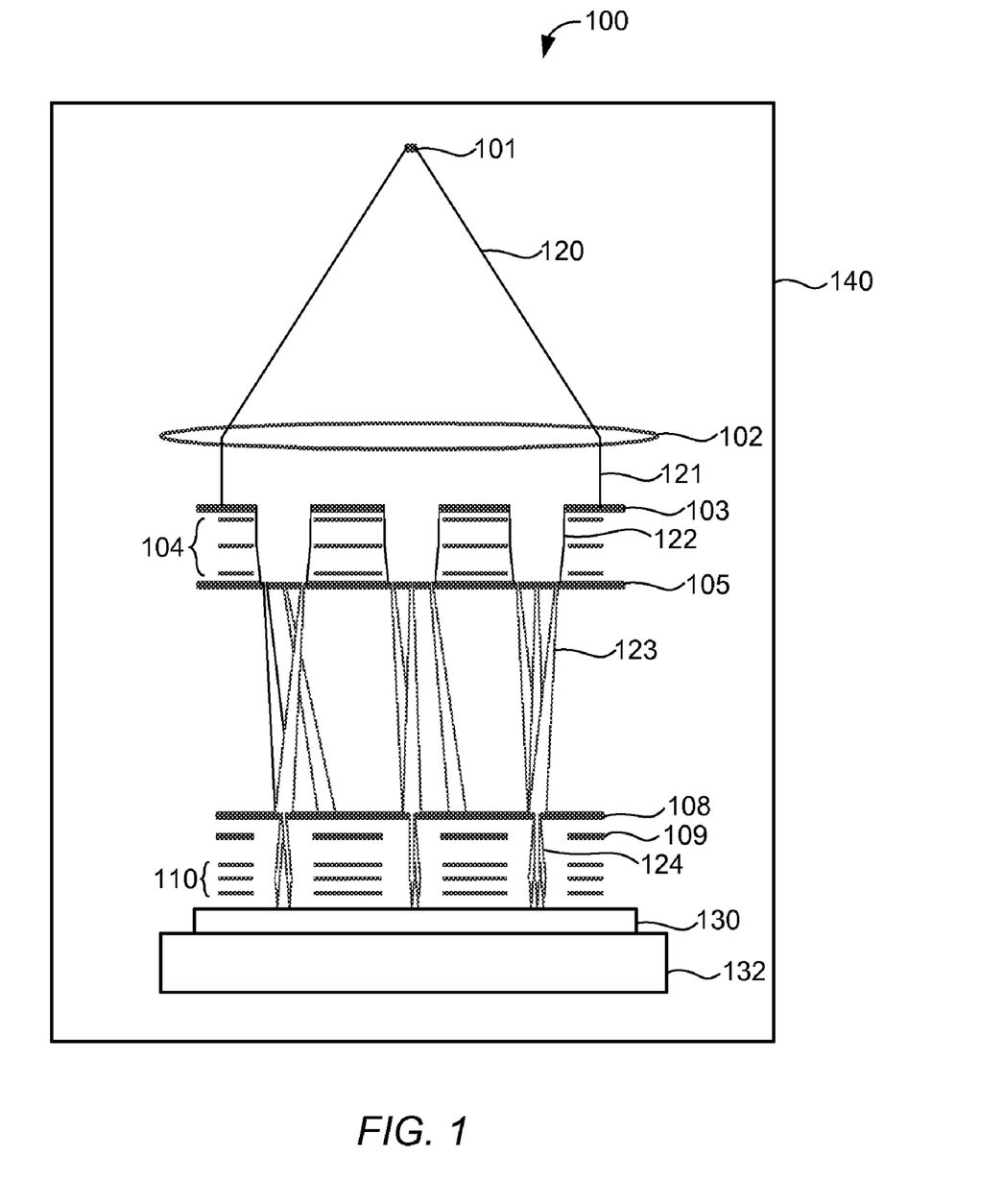
FIG. 1 is a simplified schematic drawing of an embodiment of a charged particle lithography apparatus.

FIG. 1 shows a simplified schematic drawing of an embodiment of a charged particle lithography apparatus 100. Such lithography apparatus are described for example in U.S. Pat. Nos. 6,897,458 and 6,958,804 and 7,019,908 and 7,084,414 and 7,129,502, U.S. patent application publication no. 2007/0064213, and co-pending U.S. patent applications Ser. Nos. 61/031,573 and 61/031,594 and 61/045,243 and 61/055,839 and 61/058,596 and 61/101,682, which are all assigned to the owner of the present invention and are all hereby incorporated by reference in their entirety. In the embodiment shown in FIG. 1, the lithography apparatus comprises an electron source 101 for producing an expanding electron beam 120. The expanding electron beam 120 is collimated by collimator lens system 102. The collimated electron beam 121 impinges on an aperture array 103, which blocks part of the beam to create a plurality of beamlets 122. The system generates a large number of beamlets 122, preferably about 10,000 to 1,000,000 beamlets.

The electron beamlets 122 pass through a condenser lens array 104 which focuses the electron beamlets 122 in the plane of a beam blanker array 105, comprising a plurality of blankers for deflecting one or more of the electron beamlets. The deflected and undeflected electron beamlets 123 arrive at beam stop array 108, which has a plurality of apertures. The beamlet blanker array 105 and beam stop array 108 operate together to block or let pass the beamlets 123. If beamlet blanker array 105 deflects a beamlet, it will not pass through the corresponding aperture in beam stop array 108, but instead will be blocked. But if beamlet blanker array 105 does not deflect a beamlet, then it will pass through the corresponding aperture in beam stop array 108, and through beam deflector array 109 and projection lens arrays 110.

Beam deflector array 109 provides for deflection of each beamlet 124 in the X and/or Y direction, substantially perpendicular to the direction of the undeflected beamlets, to scan the beamlets across the surface of target 130. Next, the beamlets 124 pass through projection lens arrays 110 and are projected onto target 130. The projection lens arrangement preferably provides a demagnification of about 100 to 500 times. The beamlets 124 impinge on the surface of target 130 positioned on moveable stage 132 for carrying the target. For lithography applications, the target usually comprises a wafer provided with a charged-particle sensitive layer or resist layer.

The charged particle lithography apparatus operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-3}$ mBar is typically required. In order to maintain the vacuum environment, the charged particle lithography apparatus is located in a vacuum chamber 140. All of the major elements of the lithography apparatus are preferably housed in a common vacuum chamber, including the charged particle source, projector system for projecting the beamlets onto the wafer, and the moveable wafer stage.

Figure 2:
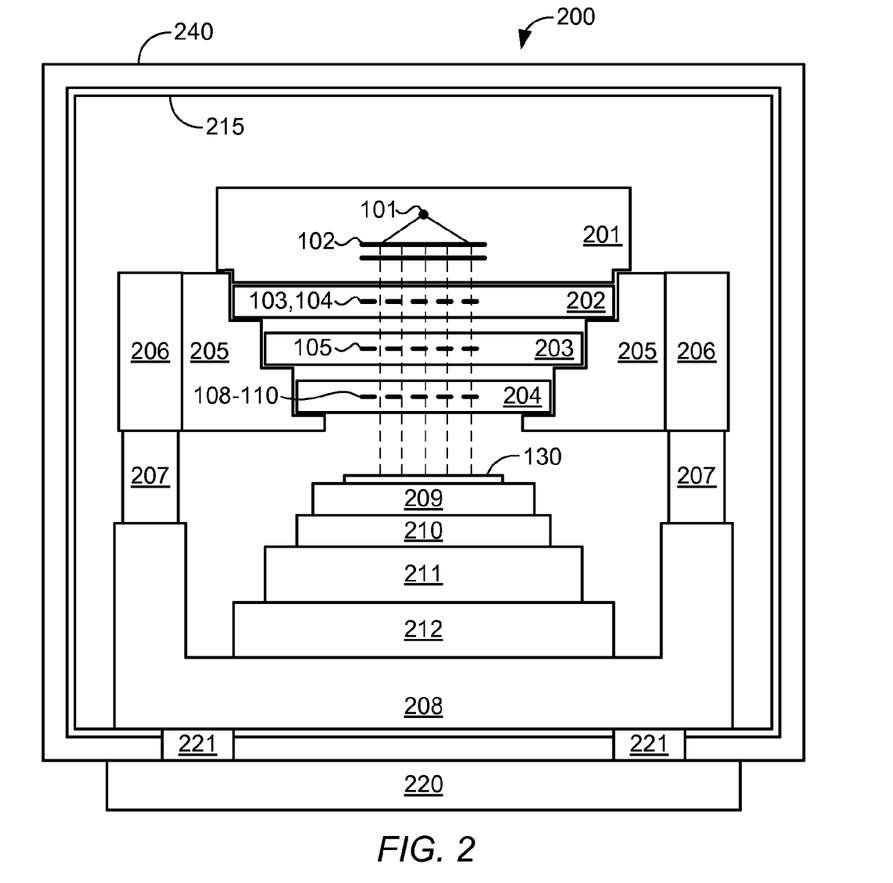
FIG. 2 is simplified block diagram of a modular lithography apparatus.

FIG. 2 shows a simplified block diagram illustrating the principal elements of a modular lithography apparatus. The lithography apparatus is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 2, these modular subsystems include an illumination optics module 201 including the charged particle beam source 101 and beam collimating system 102, an aperture array and condenser lens module 202 including aperture array 103 and condenser lens array 104, a beam switching module 203 including beamlet blanker array 105, and projection optics module 204 including beam stop array 108, beam deflector array 109, and projection lens arrays 110. The modules are designed to slide in and out from an alignment frame. In the embodiment shown in FIG. 2, the alignment frame comprises an alignment inner subframe 205 and an alignment outer subframe 206. A frame 208 supports the alignment subframes 205 and 206 via vibration damping mounts 207. The wafer 130 rests on wafer table 209, which is in turn mounted on chuck 210. Chuck 210 sits on the stage short stroke 211 and long stroke 212. The lithography machine is enclosed in vacuum chamber 240, which includes an electromagnetic shielding layer or layers 215, such as a layer comprising mu metal The machine rests on base plate 220 supported by frame members 221.

Each module requires a large number of electrical signals and/or optical signals, and electrical power for its operation. The modules inside the vacuum chamber receive these signals from control systems which are typically located outside of the chamber. The vacuum chamber includes openings, referred to as ports, for admitting cables carrying the signals from the control systems into the vacuum housing while maintaining a vacuum seal around the cables.

Each module preferably has its collection of electrical, optical, and/or power cabling connections routed through one or more ports dedicated to that module. This enables the cables for a particular module to be disconnected, removed, and replaced without disturbing cables for any of the other modules. The ports are preferably dedicated to a particular modular subsystem of the lithography machine, and may be sized and shaped according to the number of cabling connections required for a subsystem. For example, the illumination optics subsystem may require a large port, the projection optics subsystem a slightly smaller port, and the other subsystems smaller ports.

The vacuum chamber also comprises one or more openings for connection to a pumping system, e.g. one or more vacuum pumps, to pump air from the chamber to evacuate the chamber. The shape of the vacuum pump openings can be designed based on the circumstances. For example, the openings may be circular, square or rectangular in design.

Floor space within a manufacturing environment, i.e. a "fab", is valuable due to the high cost to construct and operate fabs and the increase in cost as the size of the fab is increased. Efficient use of the fab floor is thus important, and systems used in a fab, e.g. lithography apparatus as discussed with reference to FIGS. 1 and 2, are preferably designed to consume as little floor space as possible.

Figure 3:
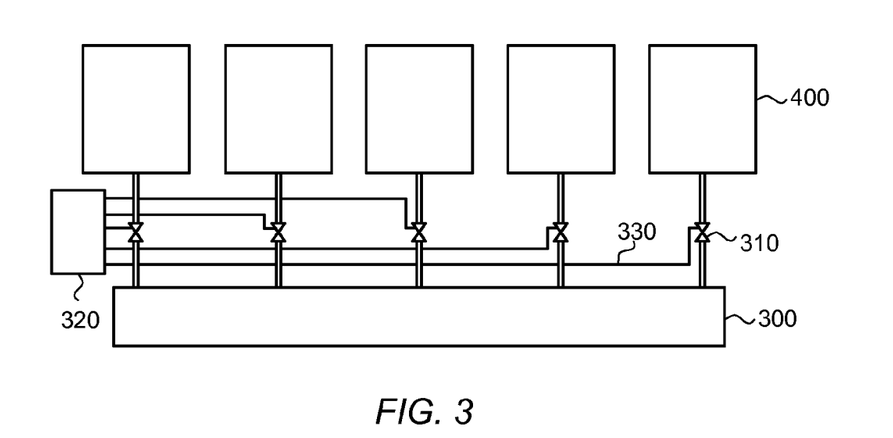
FIG. 3 schematically shows the concept of an arrangement according to an embodiment of the invention.

Some embodiments of the invention relate to an arrangement as shown in FIG. 3. FIG. 3 schematically shows an arrangement comprising a plurality of vacuum chambers 400, for example vacuum chambers accommodating one or more modules for lithographic processing as shown in FIGS. 1 and 2. The vacuum chambers are all connected to a common pumping system 300. The pumping system 300 is arranged for pumping down each vacuum chamber 400 separately.

Separate vacuum realization in each vacuum chamber 400 may be established by controlling a number of flow regulation devices 310, for example flaps or valves, by a control system 320 connected to the flow regulation devices 310 via one or more control lines 330. Control via a central control system 320 allows for an efficient control scheme. The control system 320 may base its control scheme on the actual pressure in each vacuum chamber, for example obtained by use of suitable pressure sensors.

The central control system 320 may comprise a processor arranged to execute a computer program. Such computer program may comprise elements that allow for performance of method of realizing a vacuum in each vacuum chamber. The computer program may be stored on a computer readable medium that can be loaded into the control system 320. Some embodiments of a method of realizing a vacuum may then be performed, when executed by the processor.

By combined use of at least part of the same pumping system 300 by the separate vacuum chambers 400 it is not necessary to equip each vacuum chamber 400 with separate equipment for establishing the vacuum. Several components within the pumping system 300 may be shared by vacuum chambers 400. In a fab it is highly unusual that all vacuum chambers 400 need to be pumped down simultaneously. Therefore, the shared components within the pumping system 300 may not necessarily need to be able to service different vacuum chambers 400 simultaneously. The requirements of the components, even though servicing more than one vacuum chamber 400, may correspond to the requirements for that component if only a single vacuum chamber was to be serviced. As a result, the costs of the total pumping system 300 may be considerably reduced. Additionally, the common pumping system 300 preferably occupies less fab floor space than a plurality of pumping systems would occupy, which may lead to a significant cost reduction of the process line.

Figure 4:
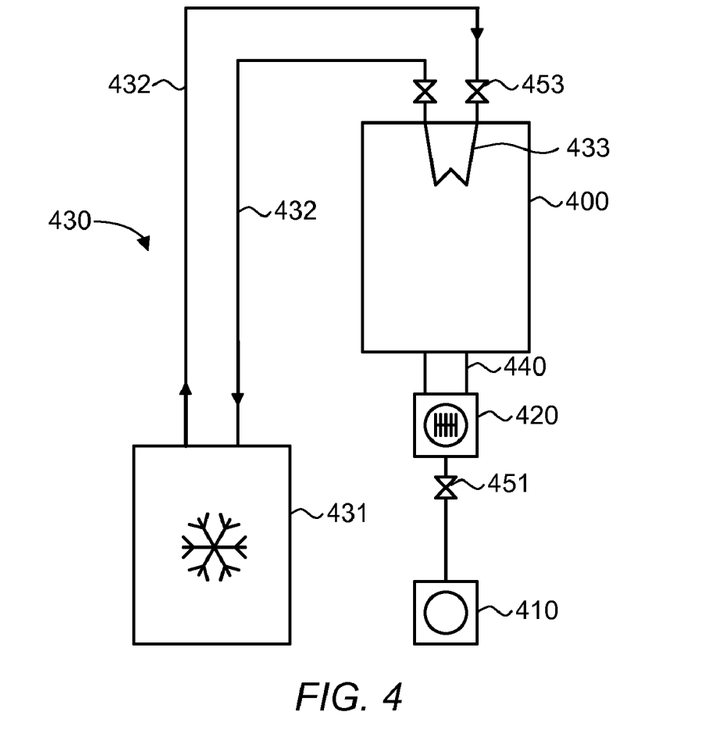
FIG. 4 schematically shows a single vacuum chamber connected to a number of pumps.

For establishing a vacuum in some embodiments of the present invention, a number of components may be used, as will be explained with reference to FIG. 4. FIG. 4 schematically shows an arrangement comprising a single vacuum chamber 400 connected to a number of pumps 410, 420, 430.

Pump 410 is a fore pump, e.g. a roughing pump, while pump 420 is a turbomolecular pump, further referred to as turbo pump 420. Both the fore pump 410 and the turbo pump 420 are connected to the vacuum chamber 400 via a pipe 440. The fore pump 410 may be used to lower the outlet pressure of the turbo pump 420 to ensure reliable and smooth operation of the turbo pump 420. The extent to which the fore pump 410 supports the turbo pump 420 may be controlled by a flow regulation device, like a valve 451 or the like.

Pump 430 actually refers to a cryopump system. The cryopump system 430 comprises a cooling fluid reservoir or cooling unit 431 placed outside the vacuum chamber 400, a cryogenic surface structure 433 placed inside or in contact with the interior of the vacuum chamber 400, and cooling lines 432 connecting the reservoir 431 with the surface structure 433. The extent to which cooling liquid is provided to the cryogenic surface structure 433 may be controlled by one or more flow regulation devices, for example valves 453 or the like. The cryopump system 430 in FIG. 4 comprises two valves 451 per cooling structure 433. A valve 451 at the input and the output of the cooling structure 433 has the advantage that it simplifies the addition and/or removal of cooling structures 433 in the cryopump system 430. This enables a truly modular arrangement of cryopump components in the arrangement.

The vacuum chamber 400 may comprise a flow regulation device, for example a valve or flap, for isolating the pumps 410, 420 from the vacuum chamber 400. The pressure level in the vacuum chamber 400 may then be solely maintained by the cryogenic pump system 430. Such isolation may allow for deactivation of one or more of pumps 410, 420 and limit vibrations coupling into the vacuum chamber 400. Such vibrations may limit the accuracy of a number of processes that could be performed in the vacuum chamber 400, for example lithography or metrology processes.

Figure 5:
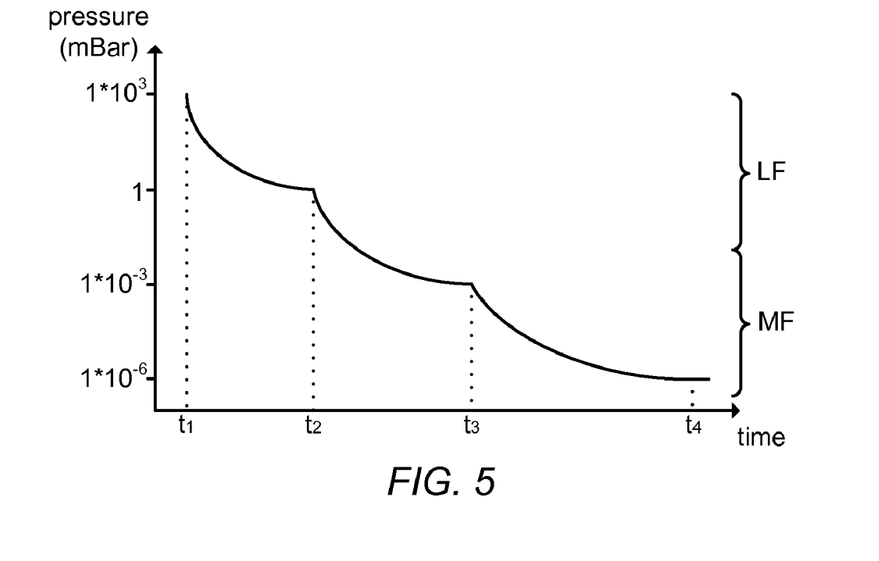
FIG. 5 schematically shows a graph of a possible pump down procedure performed with respect to the vacuum chamber of FIG. 4.

FIG. 5 schematically shows a graph of the pressure within the vacuum chamber 400 in mBar as a function of time. Before pump down, the pressure in the vacuum chamber is equal to atmospheric pressure, i.e. about 1000 mBar.

Realizing a vacuum in the vacuum chamber 400 can be performed in three stages. In the first stage, starting at time $t_1$, the fore pump 410 may be used to decrease the pressure to a value at which the turbo pump 420 can operate efficiently, e.g. 1 mBar. The fore pump 410 effectively removes existing gas and vapor from the chamber 400.

When the desired pressure value for efficient operation of the turbo pump 420 has been reached the turbo pump 420 is started at time $t_2$. The turbo pump 420 then pumps the pressure further down, in this embodiment at least down to $10^{-3}$ mBar, by removing gas and vapor resulting from outgassing. During turbo pump operation the fore pump 410 may still be used to ensure that the outlet pressure of the turbo pump 420 remains below a predetermined pressure value. If such outlet pressure can be ensured in a different manner, the fore pump 410 may be shut off, which, besides limiting the power being used, may also limit the influence of vibrations on elements in the vacuum chamber.

A third stage of operation to realize a vacuum of even lower pressure includes the initiation of use of the cryopump system 430 at time $t_3$. Activation of the cryopump system 430 after initiation of the turbo pump 420 provides for a more efficient vacuum pumping procedure. The cooling fluid reservoir/cooling unit 431 provides cooling fluid to the cryogenic surface structure 433 in the chamber 400 via the cooling lines 432, which effectively cools the surface structure 433 to a temperature at which molecules hitting the structure 433 may become frozen onto it. The surface structure 433 can only accommodate a limited number of molecules. Therefore, the cryopump system 430 is preferably not started too soon in the process to avoid early saturation of the surface structure 433. Often, the cryopump is started if the pressure in the chamber 400 reaches a pressure value below a predetermined threshold value.

Generally, a cryopump system 430 is particularly suited for removal of water from the chamber 400 and gases in the chamber generated from outgassing. Since water is one of the main contaminating substances in a number of processes, for example lithography, it is desirable that especially water is removed from the vacuum chamber 400.

After a certain period of time, in FIG. 5 at time $t_4$, the vacuum in the chamber reaches an equilibrium value, for example $10^{-6}$ mBar. The actual value being reached depends on the type of turbo pump 420 and cryopump system 430 being used, as well as the size and construction of the vacuum chamber and the processes being performed in the chamber.

A certain period of time after reaching the equilibrium value, the turbo pump 420 may be isolated from the vacuum chamber 400. After isolation of the turbo pump 420 the cryopump system 430 may continue to operate to maintain and/or complete generation of the vacuum. As a cryopump system 430 uses no moving parts, it does not introduce vibrations typically caused by other types of low temperature (<4K) systems. By isolating the turbo pump 420, the influence of vibrations caused by the turbo pump 420 can be minimized as well. In some embodiments, the turbo pump 420 is deactivated after isolation, which leaves no vibrations outstanding.

It must be understood that it is not essential for some embodiments of the invention to use a cryopump system 430 to obtain a desired equilibrium pressure. A suitable turbo pump 420 may reach a vacuum pressure value of $10^{-6}$ mBar as well. However, if a cryopump system 430 is used in way as described with reference to FIG. 5, the requirements for the turbo pump 420 may be lower, and may thus lead to a cost reduction.

To lower the vacuum pressure value pressure even lower, a heating step can be performed prior to usage of the cryopump system 430. The heating of components within and/or walls of the vacuum chamber 400 increases outgassing. The outgassed molecules may then be pumped out of the vacuum chamber 400 by means of the turbo pump 420. As a result, after termination of the heating step, the vacuum pressure value at which the cryopump is initiated can be set at a lower pressure value. In some applications, heating cannot be performed because the heat may damage components in the vacuum chamber 400.

However, specific radiation, for example by using light emitting diodes (LEDs) emitting radiation in the ultra-violet (UV) spectrum may be used to stimulate outgassing at predetermined locations in the vacuum chamber 400. UV-LEDs may be positioned in the vacuum chamber 400. Alternatively, they may be positioned outside the vacuum chamber 400 and the ultraviolet radiation may be coupled into the vacuum chamber via dedicated wall portions, for example by means of suitable fiber optics, light pipes or the like.

Preferably, the cross-sectional area of the pipe facing the vacuum chamber 400, further referred to as the outlet of the chamber, is variable. During depressurization, the flow from the chamber and through the pipe 440 between the pumps 410, 420 and the vacuum chamber changes from a laminar flow (LF) to a molecular flow (MF). In the molecular flow regime, the rate of outgassing becomes more dominant in determining the speed of further reduction of the pressure level. In some arrangements, maintaining vacuum or further reduction of pressure in the MF regime is possible by only using the cryopump system 430 and isolating the vacuum chamber 400 from the pumps 410, 420 by means of a flow regulation device as discussed earlier. However, often additional mechanical pumping is required as well. If the vacuum chambers accommodate charged particle applications, sufficient shielding from outside influences is important to prevent external electromagnetic fields from interfering with the operations taking place within the vacuum chamber at hand. In such cases, the outlet used for the additional mechanical pumping may be too large.

Figure 6:
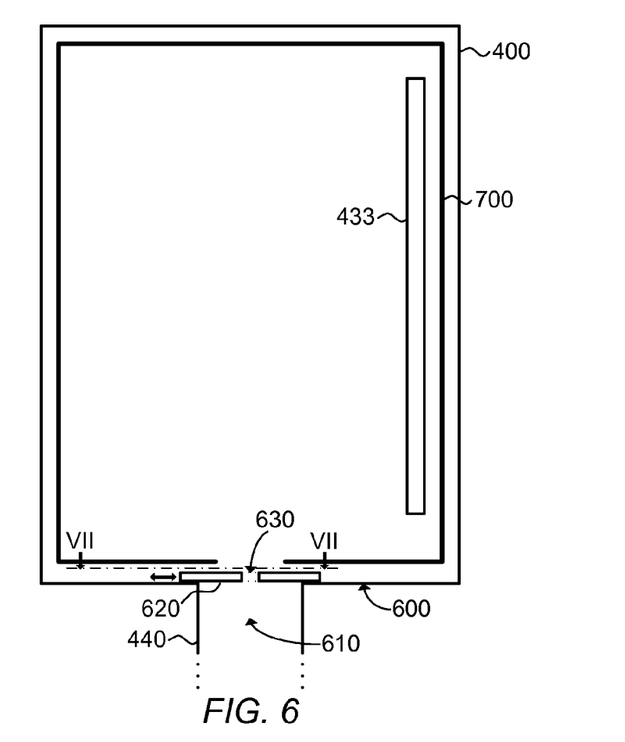
FIGS. 6 and 7 schematically show two different views on a mechanism that allows for varying the cross-sectional area of the outlet of a vacuum chamber.
Figure 7:
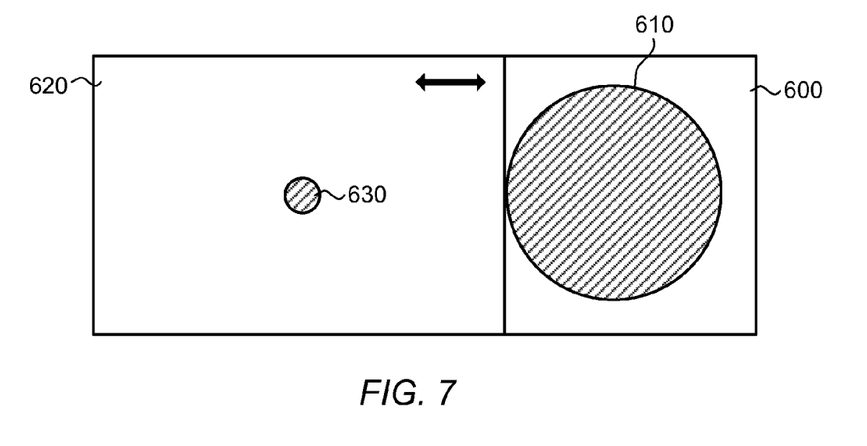

FIG. 6 schematically shows a side cross-sectional view of a vacuum chamber provided with an outlet with a variable cross-sectional area. FIG. 7 schematically shows a top view of the outlet along the line VII-VII in FIG. 6.

The vacuum chamber 400 of FIG. 6 is provided with a cryogenic surface structure 433 and an outlet with a cross-sectional area 610 connected to a pipe 440 that leads to one or more pumps (not shown). The vacuum chamber 400 further comprises a moveable member 620 for partially blocking the cross-sectional area 610 of the outlet. In the embodiment shown, the moveable member 620 takes the form of a slideable plate provided with an aperture 630. The aperture 630 has a cross-sectional area that is smaller than the cross-sectional area of the outlet. By moving the member 620 over the outlet, for example by sliding the member 620 over a rail on which the member is mounted, the cross-sectional area of the outlet is effectively reduced. The cross-sectional area of the aperture 630 may be such that the pumps connected to the pipe 440 can provide sufficient pumping action to maintain the desired vacuum requirements in the chamber 400. Due to the limited cross-sectional area of the aperture 630 pumping requirements for the pumps to maintain the vacuum may then be less demanding than without partial blocking of the outlet. Instead of using a slideable plate sliding over a rail, other types of moveable members 620 may be used. For example, the cross-sectional area 610 may be partially blocked by a door-like construction comprising one or more pivoting members that can pivot around one or more hinges. In another embodiment, spring leafs or the like may be used to move a construction to partially block the cross-sectional area 610.

As shown in FIG. 6, the chamber 400 may be provided with an electromagnetic shielding structure 700. The material used for electromagnetic shielding may be or may include mu metal. The presence of electromagnetic shielding enables the execution of operations involving charged particles in the chamber 400. Preferably, the moveable member 620 comprises an electromagnetic shielding material, for example mu metal. The use of electromagnetic shielding material in the member 620 ensures minimized influence of external electromagnetic fields, while the vacuum can be maintained in the chamber 400 via one or more pumps connected to the pipe 440.

In the embodiment shown in FIGS. 6 and 7, by selecting a distance between the small hole and the end of the plate that is equal to or exceeds the diameter of the cross-sectional area in the sliding direction, the cross-sectional area of the outlet can be controlled in substantially continuous manner.

Figure 8:
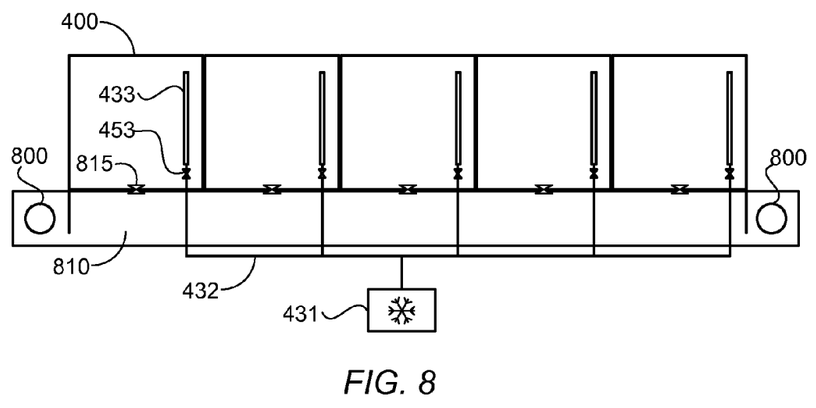
FIG. 8 schematically shows an arrangement according to an embodiment of the invention.
Figure 9:
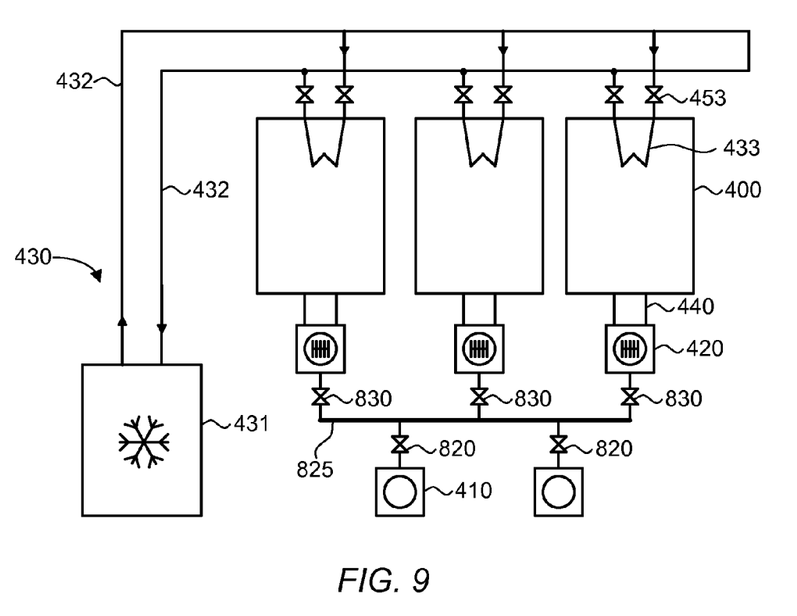
FIG. 9 schematically shows an arrangement according to another embodiment of the invention.

Now returning to the concept of an arrangement having a common pumping system connected to a number of vacuum chambers, FIGS. 8 and 9 schematically show two different embodiments. Separate pump down of individual vacuum chambers may be facilitated under the control of a central control system as discussed with reference to FIG. 3.

In the arrangement of FIG. 8, five vacuum chambers 400 share two turbo vacuum pumps 800. The vacuum pumps 800 are capable of pumping down the vacuum chambers 400 to a vacuum of at least $10^{-3}$ mBar. The vacuum pumps 800 may comprise a combination of a fore pump and a turbo pump as discussed with reference to FIG. 4.

The vacuum pumps 800 are arranged at each end of a shared duct or pipe 810. The vacuum pumps 800 serve the chambers 400 via a common duct or pipe 810. The common duct or pipe 810 is connected to each vacuum chamber 400 via a flow regulation device 815. The device 815 may be made of mu metal or may include such mu metal layer to provide shielding.

The arrangement shown in FIG. 8 allows for realizing a vacuum in each chamber separately by the using of one or both common vacuum pumps 800, and opening/closing the respective flow regulation devices 815. A flow regulation device 815 may take the form of a flap as discussed with reference to FIGS. 6, 7, i.e. element 620. Although not explicitly shown, each vacuum chamber 400 may comprise electromagnetic shielding as discussed with reference to FIGS. 6 and 7.

The ability to use more than one pump 800 to realize a vacuum in the vacuum chamber 400 enables a faster pump down. A fast pump down time is desirable because the time spent for pump down of a chamber directly reduces the throughput of the machine using the chamber. However, when a group of vacuum chambers are arranged in a cluster it may be acceptable to arrange the cluster for pump down of only one vacuum chamber at a time. This may be the case, for example, where the cluster includes a group of machines, such as lithography machines, performing the same lengthy operation on a staggered schedule. In this situation, it may be unlikely that more than one vacuum chamber 400 needs to be pumped down at the same time. The use of a limited number of pumps may result in a significant cost reduction. In this embodiment, instead of five pumps only two pumps are used shared between the five chambers. This permits a flexible arrangement that can be used to achieve faster pump down, lower total cost, and increased pump redundancy. Even if the two pumps have a capacity larger than the capacity of any of the five pumps that would normally have been used, such cost reduction may be achieved. In such case, the pump down time for each chamber may be reduced as well since the large capacity pumps may pump faster.

Furthermore, the ability to realize a vacuum in a vacuum chamber with more than one pump creates a vacuum pump redundancy that may improve the reliability of vacuum operation. In the arrangement of FIG. 8, if the left vacuum pump malfunctions, the right vacuum pump can take over its function, although pump down may be slower as one pump less is used.

Besides the ability to pump down the vacuum chambers 400 separately by one or more pumps 800, a cryopump system may be shared by the chambers 400 as well. In such case, one or more cryogenic surface structures 433 may be provided in each vacuum chamber 400 to capture molecules, preferably water vapor molecules, to assist in forming the vacuum in the chamber 400. In this exemplary embodiment, the surface structures 433 take the form of cryopump shields, but other structures are possible as well, for example cryopump spirals. The vacuum in the vacuum chambers 400 of the arrangement shown in FIG. 8 can thus be generated by the vacuum pumps 800 and the cryogenic surface structures 433 of the cryopump system 430, for example in a way as discussed with reference to FIG. 5.

The presence of the cryopump system having cryogenic surface structures 433 in separate vacuum chambers 400 may help to reduce the size of the vacuum pumps 800 needed to produce an adequate vacuum. Furthermore, it may help reducing pump down time. Moreover, as already mentioned earlier, a cryopump system 430 uses no moving parts so that it does not introduce vibrations typically caused by other types of low temperature (<4K) systems.

The arrangement shown in FIG. 8 may be modified to accommodate multiple layers of stacked vacuum chambers, with vacuum chambers being stacked vertically as well as or in addition to being arranged side-by-side. Two, three, or possibly more layers of vacuum chambers may be used, for example creating an arrangement of 10 chambers (for two layers) or 15 chambers (for three layers) in the arrangement shown in FIG. 8. Multiple chambers may utilize a common vacuum pumping system and a common vacuum pumping system may be utilized for each layer of chambers. Vertically stacking of vacuum chambers further reduces the floor space needed, which may account for a substantial cost reduction of the process line the vacuum chambers are part of.

FIG. 9 shows another arrangement according to another embodiment of the invention. Just like the arrangement shown in FIG. 8, this arrangement also has the capability of realizing a vacuum in each vacuum chamber 400 separately. In FIG. 9, three vacuum chambers 400 are connected to a pumping system. The pumping system comprises two fore pumps 410, three turbo pumps 420, and a cryopump system 430. The cryopump system 430 comprises a cooling fluid reservoir or cooling unit 431, cryogenic surface structures 433 and cooling lines 432 to provide cooling fluid from the reservoir 431 to the surface structures 433. The cryogenic surface structures 433 are provided in each vacuum chamber 400.

In contrast to the arrangement shown in FIG. 8, each vacuum chamber 400 is connected to a separate turbo pump 420 via a pipe 440. The use of a single turbo pump 420 per vacuum chamber 400 allows for a two tiered arrangement of pumps 410 and 420 with a reduction of piping.

The arrangement further comprises a number of flow regulation devices 820, e.g. valves, for controlling the connection between the fore pumps 410 and an intermediate line 825. In some embodiments, only one fore pump 410 is used, while the other fore pump serves as a substitute pump in case of failure or maintenance of the main fore pump. The fore pumps may also be arranged so that one pump is used for pump down of a chamber, and the other pump is used to maintain the vacuum of other chambers which have already been pumped down. Additionally, each turbo pump 420 is connected to the intermediate line 825 via a further flow regulation device 830, for example a valve or a flap. Control of regulation devices 820, 830 allows for controlling which vacuum chamber 400 is to be pumped down.

The cryogenic surface structures 433 are connected to the cooling lines 432 via one or more flow regulation devices 453. By controlling these devices 453 each vacuum chamber 400 may be connected to the cryopump system 430 separately.

Although not explicitly shown, each vacuum chamber 400 may further be provided with other features like a moveable member and/or electromagnetic shielding as discussed with reference to FIGS. 6 and 7.

The cryogenic surface structure 433 discussed throughout this description may take any suitable form. In some embodiments, the structure may take the form of a shield as schematically shown in FIGS. 7 and 8. A shield is relatively easy to manufacture, and its dimensions can be easily shaped in view of the shape of the vacuum chamber without interfering with components residing therein. Alternatively, the cryogenic surface structure may take the form of a spiral as schematically shown in FIGS. 4 and 9. A spiral has the advantage that it is relatively easy to manufacture. Other shapes or combination of shapes, like the combination of a shield mounted on a spiral, are possible as well. The cooling structure shape design may be optimized to obtain a relatively large surface area available for cryopump action per unit volume.

Figure 10A:
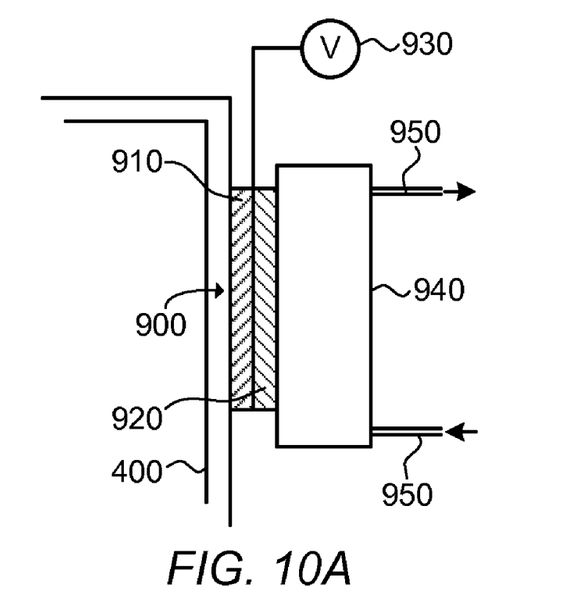
FIGS. 10A, 10B schematically show an alternative set-up of cryogenic cooling.

In some embodiments, as an alternative way of cryogenic cooling, a thermoelectric cooling element using the so-called Peltier effect is used. FIG. 10A schematically shows a portion of a vacuum chamber 400 provided with such cooling element 900. The cooling element 900 comprises two different types of materials 910, 920, each material type 910, 920 being provided at a different side of the cooling element. At the junction of the two different materials, a heat flux is created against the temperature gradient, that is from cold to hot.

The transfer of heat from the one material type 910 to the other material type 920 takes place with consumption of electrical energy. Connecting the cooling element 900 to a direct current voltage source 930 causes one side of the element 900 to cool, while the other side is heated. The performance of the thermoelectric cooling element may increase by active heat removal away from the heated side 920 of the element 900. For this purpose, the hot side 920 of the cooling element 900 may be placed in contact with a cooling structure 940.

The combination of the cooling structure and the thermoelectric cooling element may then qualify as the cryogenic surface structure. The cooling structure may receive cooling liquid via cooling lines 950 which may correspond to the cooling lines 432 discussed earlier with reference to FIGS. 4 and 9. However, the cooling structure 940 may use other cooling fluids than used in the embodiments shown earlier. For example, cooling of the hot side 920 may be performed with cooling water as a cooling fluid.

In FIG. 10A the cooling element 900 is positioned outside and in contact with the vacuum chamber 400. The cooling side 910 of the cooling element 900 effectively cools a portion of the vacuum chamber wall in close proximity of the cooling element 900. This wall portion then effectively has the function of a cryogenic surface structure as discussed earlier. The use of a cooling element 900 as described with reference to FIG. 10A is a relatively cheap way of creating a cryogenic pumping effect. As mentioned earlier, there is no need for the use of a dedicated cooling fluid or a cooling fluid that is relatively difficult to handle. Instead, cooling water may be sufficient. Furthermore, the cooling element 900 may operate at low voltages. The element 900 is therefore safe to use.

Figure 10B:
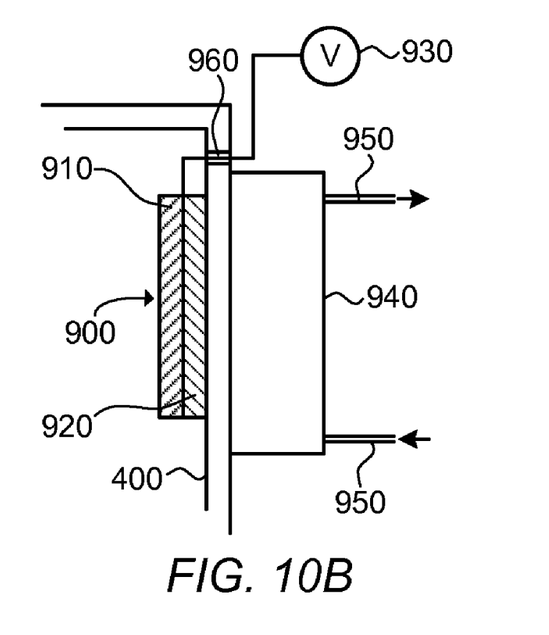

It may be desirable to control the surface area of the cryogenic surface structure in the vacuum chamber though. In such case, as shown in FIG. 10B, the cooling element 900 may be positioned inside the vacuum chamber 400. The cold side 910 of the cooling element 900 now serves as cryogenic surface structure. In this embodiment, the vacuum chamber 400 needs to be provided with an additional port 960 to allow electrical feed through.

Although the Peltier cooler is not very efficient at low temperatures, it has several advantages. The Peltier cooling element has no moving parts resulting in low maintenance costs. It uses low voltage, and may be installed in the vacuum chamber without requiring piping and the introduction of cooling fluids into the chamber, thus avoiding security issues in its application. In addition, a Peltier cooling element is inexpensive, the comparative costs for a turbo pump is approximately 50 Euro per liter per second, cryopump approximately 1 Euro per liter per second, and Peltier cooling element approximately 0.1 Euro per liter per second.

The invention has been described by reference to certain embodiments discussed above. It should be noted various constructions and alternatives have been described, which may be used with any of the embodiments described herein, as would be know by those of skill in the art. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A method of realizing a vacuum in vacuum chambers, wherein the vacuum chambers are connected to a pumping system shared by the plurality of vacuum chambers, the method comprising separately pumping down each vacuum chamber, wherein the pumping system comprises a vacuum pump system and a cryopump system, the cryopump system comprising cryogenic surface structures located in or in contact with the interior of the vacuum chambers, and the method further comprises activating the vacuum pump system and the cryopump system for pumping down the vacuum chambers; wherein the cryopump system further comprises one or more flow regulation devices for controlling transfer of cooling fluid through the cooling lines to or away from one or more cryogenic surface structures.

2. The method of claim 1 comprising activating the vacuum pump system first followed by activating the cryopump system to realize the vacuum.

3. The method of claim 2, wherein the vacuum pump system further comprises a fore pump and at least one turbomolecular pump, and wherein the step of activating the vacuum pump system comprises activating the fore pump first followed by activating the at least one turbomolecular pump.

4. The method of claim 3, further comprising deactivating the fore pump a predetermined time period after activating the at least one turbomolecular pump.

5. The method of claim 3, wherein each vacuum chamber is connected to a separate turbomolecular pump, and wherein the step of activating the vacuum pump system comprises activating each turbomolecular pump connected to a corresponding one of the vacuum chambers to pump down the corresponding vacuum chamber.

6. The method of claim 5, wherein pumping down of a vacuum chamber of the set of vacuum chamber further comprises closing a flow regulation device to isolate the turbo pump from the vacuum chamber, and deactivating the turbomolecular pump connected to the vacuum chamber.

7. The method of claim 5, wherein each vacuum chamber is provided with an outlet connecting the vacuum chamber to the corresponding turbomolecular pump, the method further comprising varying a cross-sectional area of the outlet.

8. The method of claim 7, wherein varying the cross-sectional area of the outlet comprises blocking at least part of the outlet by means of a moveable member.

9. A lithography system comprising an arrangement of a plurality of vacuum chambers connected to a pumping system, wherein the pumping system is arranged for pumping down each vacuum chamber separately, wherein the pumping system comprises a vacuum pump system and a cryopump system, and wherein the cryopump system comprises cryogenic surface structures located in or in contact with the interior of the vacuum chambers; wherein the cryopump system further comprises one or more flow regulation devices for controlling transfer of cooling fluid through the cooling lines to or away from one or more cryogenic surface structures.

10. The system of claim 9, wherein the lithography system comprises a charged particle projection system provided with an electromagnetic shield.

11. The system of claim 10, wherein the cryopump system is embodied as a shared system, comprising one or more cooling fluid reservoirs or cooling units, and cooling lines connecting the cooling fluid reservoirs or cooling units with the cryogenic surface structures.

12. The system of claim 11, wherein a wall of each vacuum chamber is arranged to accommodate a cryogenic surface structure in the form of a thermoelectric cooling element.

13. The system of claim 12, wherein at least a portion of the wall serves as cryogenic surface structure.

14. The system of claim 13, wherein a thermoelectric cooling element contacts the outside surface of the wall portion.

15. The system of claim 10, wherein the vacuum pump system comprises a fore pump and at least one turbomolecular pump, and each vacuum chamber is connected to a separate turbomolecular pump.

16. The system of claim 10, wherein at least one vacuum chamber comprises a further flow regulation device for isolating the vacuum pump system from the vacuum chamber.

17. The system of claim 9, wherein the vacuum chamber is provided with an outlet for connection to the pumping system, the outlet having a variable cross-sectional area.

18. The system of claim 17, wherein the vacuum chamber is further provided with a moveable member for blocking at least part of the cross-sectional area of the outlet.

19. The system of claim 18, wherein the moveable member comprises an electromagnetic shielding material such as mu metal.

20. The system of claim 9, wherein at least one vacuum chamber comprises one or more light emitting diodes for emitting radiation in the ultraviolet spectrum.

21. The system of claim 9, wherein at least one vacuum chamber is arranged with dedicated wall portions for allowing a coupling of ultraviolet radiation into the chamber.

22. The system of claim 9, wherein at least one vacuum chamber is arranged for accommodating a lithography apparatus comprising:
- an illumination source for creating one or more illumination beams;
- a projection system for projecting the beams onto a substrate; and
- a moveable substrate support structure for carrying the substrate;

wherein the vacuum chamber comprises at least one opening for transferring substrates into and/or out of the chamber.

23. The system of claim 22, wherein the illumination source is a charged particle source, and the illumination beams are charged particle beams.

24. The system of claim 23, wherein the lithography apparatus comprises one or more self-contained and removable modules, the removable modules comprising one or more of:
   an illumination optics module including an illumination source and beam collimating system;
   an aperture array and condenser lens module including an aperture array and condenser lens array;
   a beam switching module including a beamlet blanker array; and
   a projection optics module including a beam stop array, beam deflector array, and one or more projection lens arrays.

25. The system of claim 11, wherein the cryogenic surface structures take the form of a cryopump shield or spiral.

26. The system of claim 18, wherein the moveable member comprises a plate with an aperture having a cross-sectional area smaller than the cross-sectional area of the outlet.

* * * * *